United States Patent [19]
Holm et al.

[11] Patent Number: 5,501,990
[45] Date of Patent: Mar. 26, 1996

[54] HIGH DENSITY LED ARRAYS WITH SEMICONDUCTOR INTERCONNECTS

[75] Inventors: Paige Holm, Phoenix; Benjamin W. Gable, Chandler, both of Ariz.

[73] Assignee: Motorola, Schaumburg, Ill.

[21] Appl. No.: 415,796

[22] Filed: Apr. 3, 1995

Related U.S. Application Data

[62] Division of Ser. No. 239,672, May 9, 1994.

[51] Int. Cl.$^6$ .................................................. H01L 21/20
[52] U.S. Cl. ........................... 437/23; 437/51; 437/127; 437/905; 437/906
[58] Field of Search ........................... 437/23, 51, 126, 437/127, 905, 906

[56] References Cited

U.S. PATENT DOCUMENTS

| | | | |
|---|---|---|---|
| 4,639,999 | 2/1987 | Daniele | 432/23 |
| 4,845,052 | 7/1989 | Abend | 437/127 |
| 4,879,250 | 11/1989 | Chan | 437/127 |
| 4,999,310 | 3/1991 | Kim | 437/23 |
| 5,084,742 | 1/1992 | Tokuda | 437/127 |
| 5,086,004 | 2/1992 | Quintana | 437/23 |
| 5,094,970 | 3/1992 | Yoshida | 437/905 |
| 5,196,369 | 3/1993 | Hayakawa | 437/127 |
| 5,231,049 | 7/1993 | Neugebauer et al. | 437/23 |
| 5,242,840 | 9/1993 | Kim | 437/127 |

FOREIGN PATENT DOCUMENTS

| | | | |
|---|---|---|---|
| 61-81679 | 4/1986 | Japan | 437/23 |
| 0677531 | 3/1994 | Japan | 437/23 |

Primary Examiner—Kevin M. Picardat
Attorney, Agent, or Firm—Eugene A. Parsons

[57] ABSTRACT

A high density LED array with semiconductor interconnects includes a plurality of layers of material stacked on a substrate including a conductive layer, a first carrier confinement layer, an active layer, and a second carrier confinement layer. The layers are separated into isolated LEDs in a matrix of rows and columns with the conductive layer connecting a first electrode of each LED in a column to a first electrode of each other LED in the column. Row conductors connect a second electrode of each LED in a row to a second electrode of each other LED in the row and column conductors are connected to the conductive layer of each column.

15 Claims, 4 Drawing Sheets

HIGH DENSITY LED ARRAYS WITH SEMICONDUCTOR INTERCONNECTS

This is a division of application Ser. No. 08/239,672, filed May 9, 1994, pending.

FIELD OF THE INVENTION

The present invention pertains to light emitting diode arrays and more specifically to light emitting diode arrays utilizing less surface area.

BACKGROUND OF THE INVENTION

Light emitting diodes (LEDs) are useful in various displays and especially in a new compact virtual display which utilizes an array of LEDs as an image source. The image source consists of a high pixel count (240 columns by 144 rows for a total of 34,560 pixels) 2-dimensional array of LEDs. The array of LEDs is used to form complete images containing pictorial (graphic) and/or alphanumeric characters. The complete images are then magnified to produce virtual images which appear to an operator to be at least the size of a standard sheet of paper.

One important factor in the quality of an image viewed on a given display, whether real or virtual, is the fill factor of the pixels within the emitting area. A high fill factor is desirable to obtain high quality images. For CRTs, the emission profiles of adjacent pixels actually overlap giving effective fill factors greater than unity, and producing a very smooth (not grainy) image. With matrix LED displays, however, it is not possible to achieve unity fill factors since there needs to be isolation between pixels. In addition, since conventional row/column matrix addressing schemes use metal row and column interconnects, there needs to be room for the column and row interconnect busses to pass through the pixel and to make contact to each electrode of the diode making up the pixel. For the columns, this interconnect component turns out to be the major component in the space required between pixels because of the minimum line width and alignment tolerances associated with this interconnect bus/contact processing.

In a copending application entitled "Electro-optic Integrated Circuit and Method of Fabrication", filed of even date herewith, and assigned to the same assignee, a method of fabricating LED arrays is disclosed utilizing mesa etched processing technology. As can be seen in the figures of this copending application, one minimum dimension is needed for isolation, another for the column bus/cathode contact, and two alignment tolerances for placement of the metal. Generally, utilizing the present semiconductor fabrication techniques, 2 micron minimum line widths, spaces and alignment tolerances together with a 10 micron emission square for each diode give a minimum linear fill factor of 0.5 or an area fill factor of $(0.5)^2=0.25$. The images produced by this display are somewhat grainy as a result of this relatively low fill factor.

Another problem faced in productizing the etched mesa LED arrays of the above describe copending application, at the present time, is the nonplanarity of the resulting structures. Efficient opto-electronic light emitters require relatively thick layers of epitaxial material grown on a substrate. Because of the relatively thick layers of epitaxially grown material, the mesa etching produces nonplanarities which tend to be on the order of 1 micron or greater. Such large nonplanarities can lead to problems with resolute photolithography, uniform dielectric coverage, metal step coverage, or metal column and row connectors.

Accordingly, it is highly desirable to provide methods of fabricating LED arrays which overcome these problems.

It is a purpose of the present invention to provide a new and improved method of fabricating LED arrays.

It is a further purpose of the present invention to provide a new and improved LED array with a substantially improved fill factor.

It is still a further purpose of the present invention to provide a new and improved method of fabricating LED arrays which is simpler and more efficient than prior methods and which is easily adaptable to high production levels.

It is another purpose of the present invention to provide a new and improved method of fabricating LED arrays which provides substantially planar semiconductor chips.

SUMMARY OF THE INVENTION

The above problems and others are at least partially solved and the above purposes and others are realized in a high density light emitting diode array with semiconductor interconnects including a plurality of layers of material formed on a substrate including at least a conductive layer of material supported by a major surface of the substrate, a first carrier confinement layer on the conductive layer, an active layer on the first carrier confinement layer, and a second carrier confinement layer on the active layer. The plurality of layers of material are separated into a plurality of isolated light emitting diodes positioned in a matrix of rows and columns with the conductive layer connecting a first electrode of each diode in a column to a first electrode of each other diode in the column. A plurality of row conductors, one for each row, connect a second electrode of each diode in a row to a second electrode of each other diode in the row and a plurality of column conductors, one for each column, are connected, one each, to the conductive layer adjacent an end of each column.

The above problems and others are at least partially solved and the above purposes and others are further realized in a method of fabricating a high density light emitting diode array with semiconductor interconnects including the step of providing a substrate of non-conductive material with a major surface, a conductive layer of material on the major surface of the substrate, a first carrier confinement layer on the conductive layer, an active layer on the first carrier confinement layer and a second carrier confinement layer on the active layer. The method further includes the step of separating portions of the second carrier confinement layer, the active layer and the first carrier confinement layer into a plurality of light emitting diodes positioned in rows and columns and separating the conductive layer into a plurality of columns connecting a first-contact of each light emitting diode in a column to a first contact of each other light emitting diode in the column. Finally, the steps of forming column contacts connected to the conductive layer at an end of each column and forming a row contact on the cap layer of each light emitting diode and connecting row contacts for all light emitting diodes in a row are performed.

BRIEF DESCRIPTION OF THE DRAWINGS

Referring to the drawings.

DESCRIPTION OF THE PREFERRED EMBODIMENTS

Figure 1:
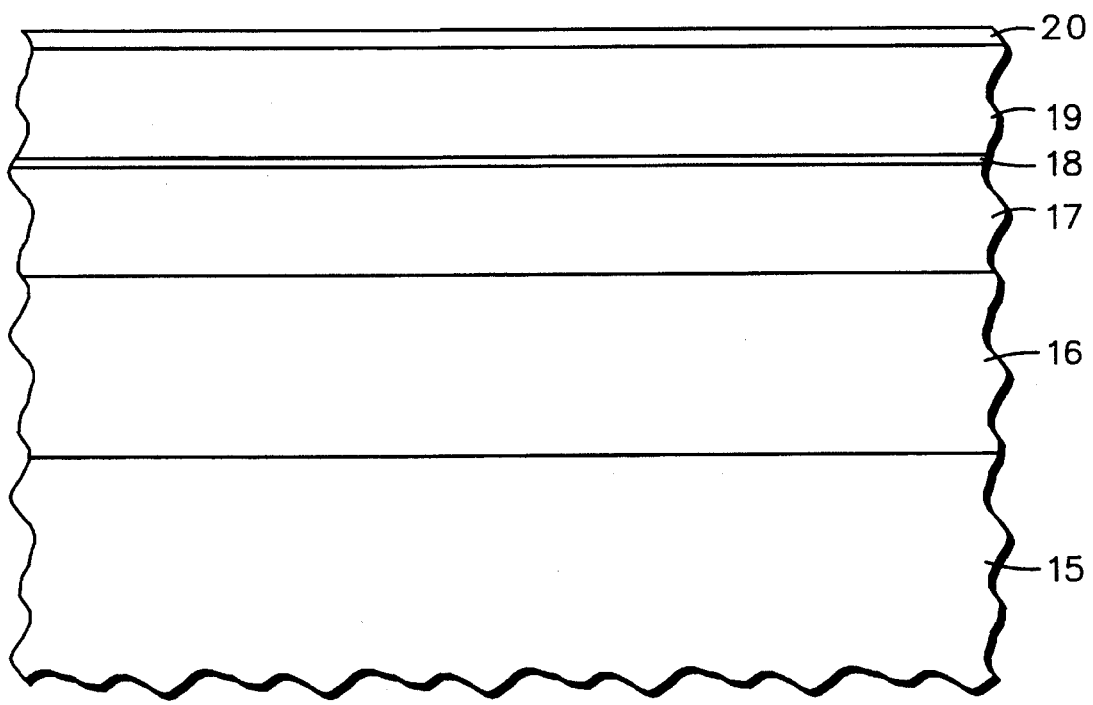
FIGS. 1 and 2 are simplified sectional views illustrating various steps in a fabrication process of an array of light emitting diodes, portions thereof broken away.

Referring specifically to FIG. 1, a first structure in a fabrication process of an array of light emitting diodes is illustrated in a simplified sectional view, portions thereof broken away. The structure includes a substrate 15 having an upper surface on which is positioned, in the following order, a conductive layer 16, a first carrier confinement layer 17, an active layer 18, a second carrier confinement layer 19 and a conductive cap layer 20.

In a specific embodiment of the fabrication process, substrate 15 is formed of undoped gallium arsenide (GaAs) so that substrate 15 is a semi-insulating semiconductor. Conductive layer 16 is a layer of GaAs epitaxially grown on the surface of substrate 15 and is heavily doped ($10^{18}$ or greater) with a dopant such as selenium, silicon, etc. to make it a relatively good N+–type conductor. In this specific example, conductive layer 16 is grown to a thickness in the range of approximately 1000–10,000 angstroms. First carrier confinement layer 17 is a layer of indium-gallium-aluminum phosphide epitaxially grown on the surface of conductive layer 16 and doped ($10^{17}14\ 10^{18}$) with silicon for N-type semiconductivity. In this specific embodiment, carrier confinement layer 17 is grown to a thickness in the range of approximately 1000–8000 angstroms. Active layer 18 is an undoped layer of indium-gallium-aluminum phosphide epitaxially grown on the surface of carrier confinement layer 17 to a thickness in the range of approximately 100–1000 angstroms. Second carrier confinement layer 19 is a layer of indium-gallium-aluminum phosphide epitaxially grown on the surface of active layer 18 and doped ($10^{16}$–$10^{18}$) with zinc for P-type semiconductivity. In this specific embodiment, carrier confinement layer 19 is grown to a thickness in the range of approximately 1000–8000 angstroms. Conductive cap layer 20 is epitaxially grown on the surface of carrier confinement layer 19 to a thickness in the range of approximately 200–1000 angstroms and is heavily doped ($10^{19}$) with zinc to make it a good P+–type conductor. The molecular fraction of aluminum in carrier confinement layers 17 and 19 is in the range of approximately 0.7–1.0 and in active layer 18 is approximately 0.0 to 0.24. For simplicity of fabrication in the specific example disclosed, layers 16 through 20 are epitaxially grown as blanket layers over the entire substrate 15 but it will be understood that other methods, including masking and selective growth or selective etching, can be utilized to provide the area necessary for the following steps.

Figure 2:
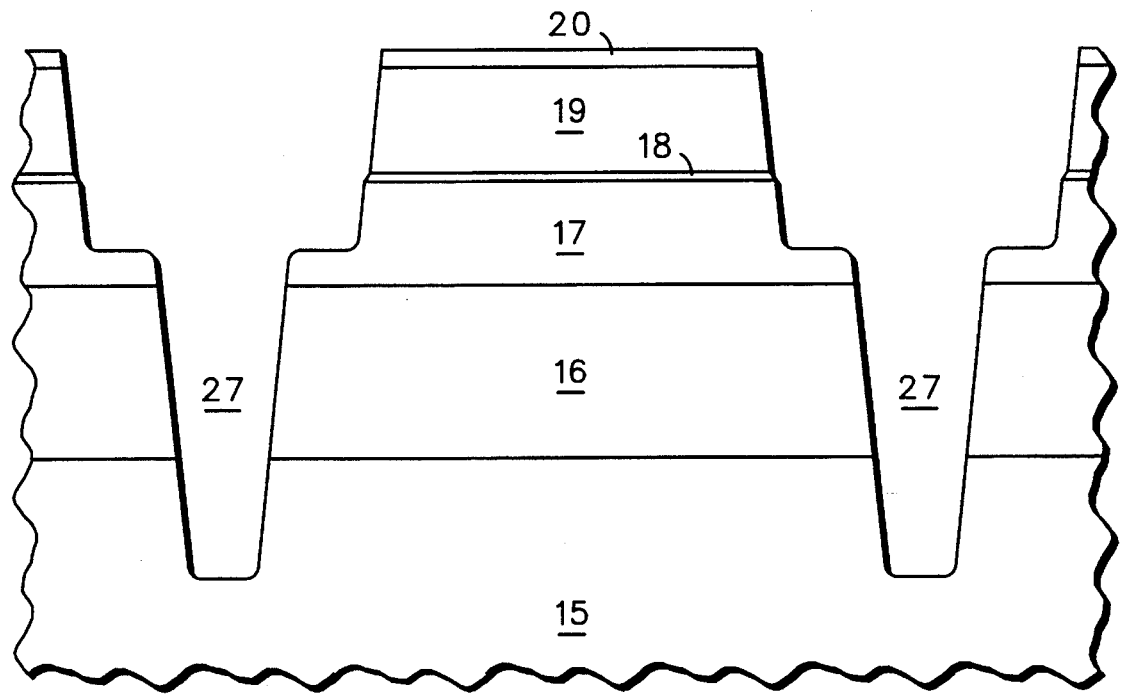

Referring specifically to FIG. 2, a second structure is illustrated in which portions of cap layer 20, carrier confinement layer 19, active layer 18 and carrier confinement layer 17 have been etched to form, or separate, mesas organized into a two dimensional array or matrix of rows and columns (only one mesa illustrated for convenience).

Figure 3:
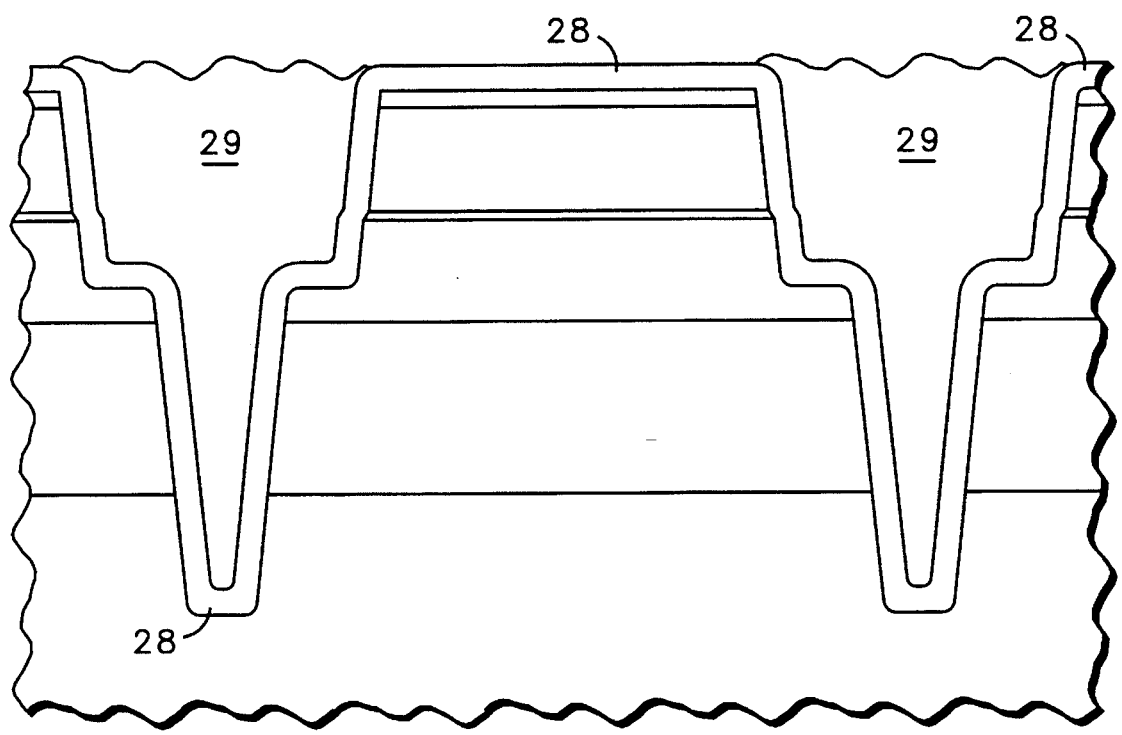
FIG. 3 is a simplified sectional view as seen generally along a column of an array of light emitting diodes embodying the present invention, portions thereof broken away.
Figure 4:
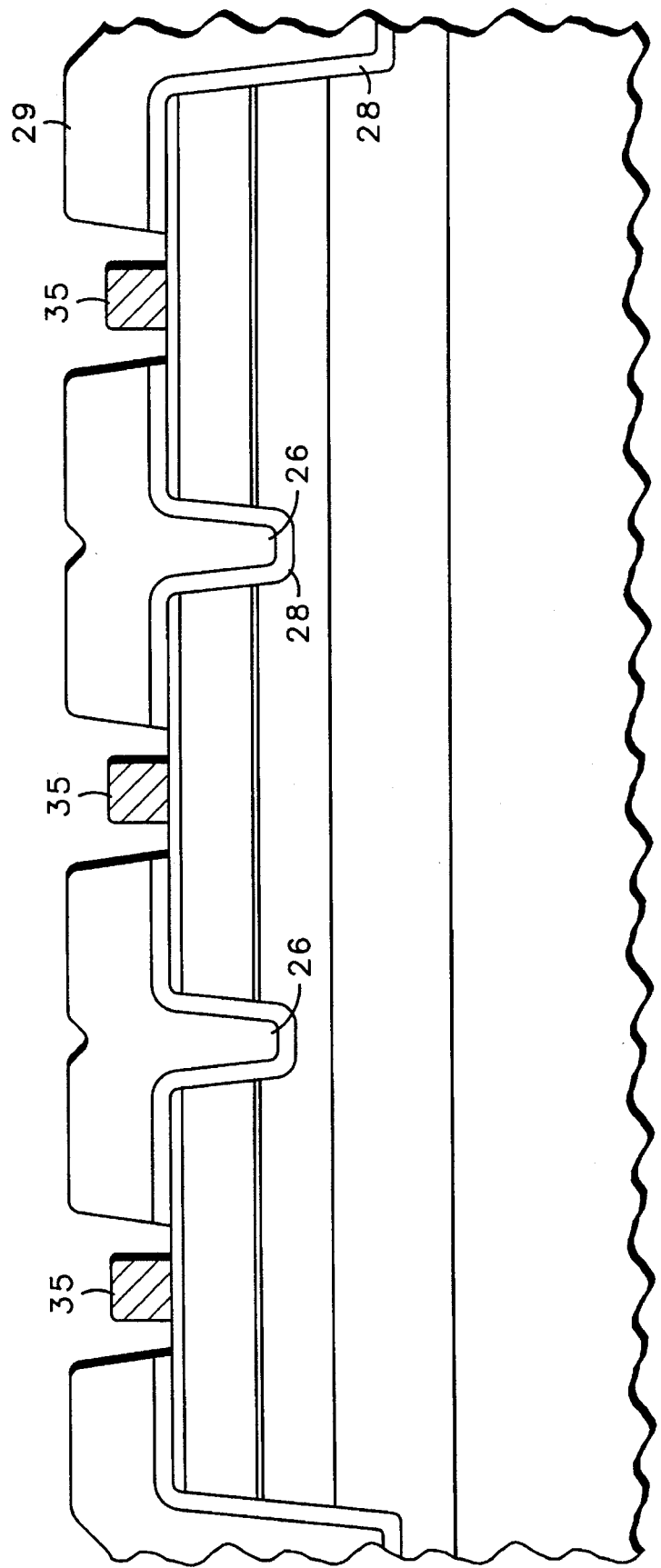
FIG. 4 is a simplified sectional view as seen generally along a row of the array of light emitting diodes of FIG. 3, portions thereof broken away.

FIG. 3 illustrates a sectional view taken generally along a row of the array and FIG. 4 illustrates a sectional view taken generally along a column of the array. The upper surface of each mesa in the array defines a light emitting area for a light emitting diode.

A column isolation step (see FIG. 2) is performed by etching trenches 27 through cap layer 20, carrier confinement layer 19, active layer 18, carrier confinement layer 17, conductive layer 16 and partially into substrate 15. Trenches 27 extend the entire length of each column so that conductive layer 16 is separated into a plurality of columns, each column of conductive layer 16 being associated with only one column of mesas and each column of mesas being electrically separated from each other column of mesas by a trench 27.

In a similar fashion, the mesas are defined by etching a trench 26 through cap layer 20, carrier confinement layer 19, active layer 18 and partially into carrier confinement layer 17 between each row in the array, as illustrated in FIG. 4. Each trench 26 extends the length of a row and prevents cross-talk between adjacent light emitting diodes in a column while allowing the lower terminal of each light emitting diode in a column to be connected to the lower terminal of each other light emitting diode in the same column.

Figure 6:
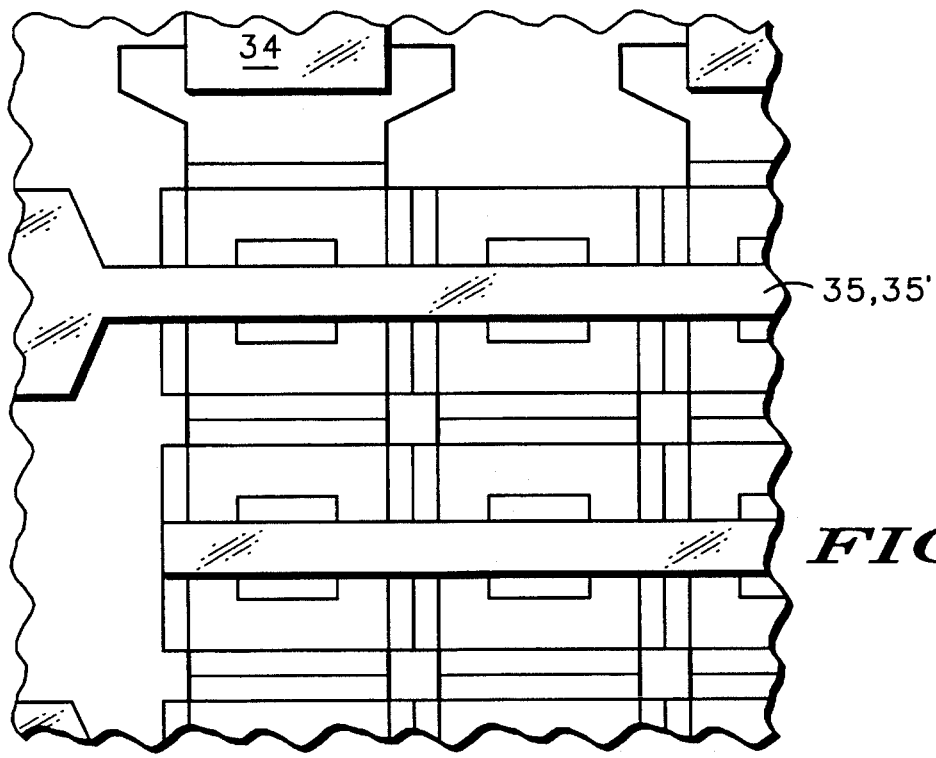
FIG. 6 is a view in top plan of a portion of the array of FIGS. 3 or 5.

A layer 28 of dielectric material, which in this specific example is $Si_3N_4$, is then deposited over the wafer to provide passivation of the etched surfaces and isolation between metal layers, as illustrated in FIGS. 3 and 4. The wafer surface is replanarized with a layer 29 of polyimide. Vias are then etched in layer 29 and layer 28 on the top of each of the mesas to provide access to conductive cap layer 20. P-contact metal 35 is applied to the exposed surface of conductive cap layer 20 using standard lift-off techniques to ohmic contacts with the upper terminal of each light emitting diode in a row and to form row current buses therebetween, as illustrated in FIG. 6.

Figure 5:
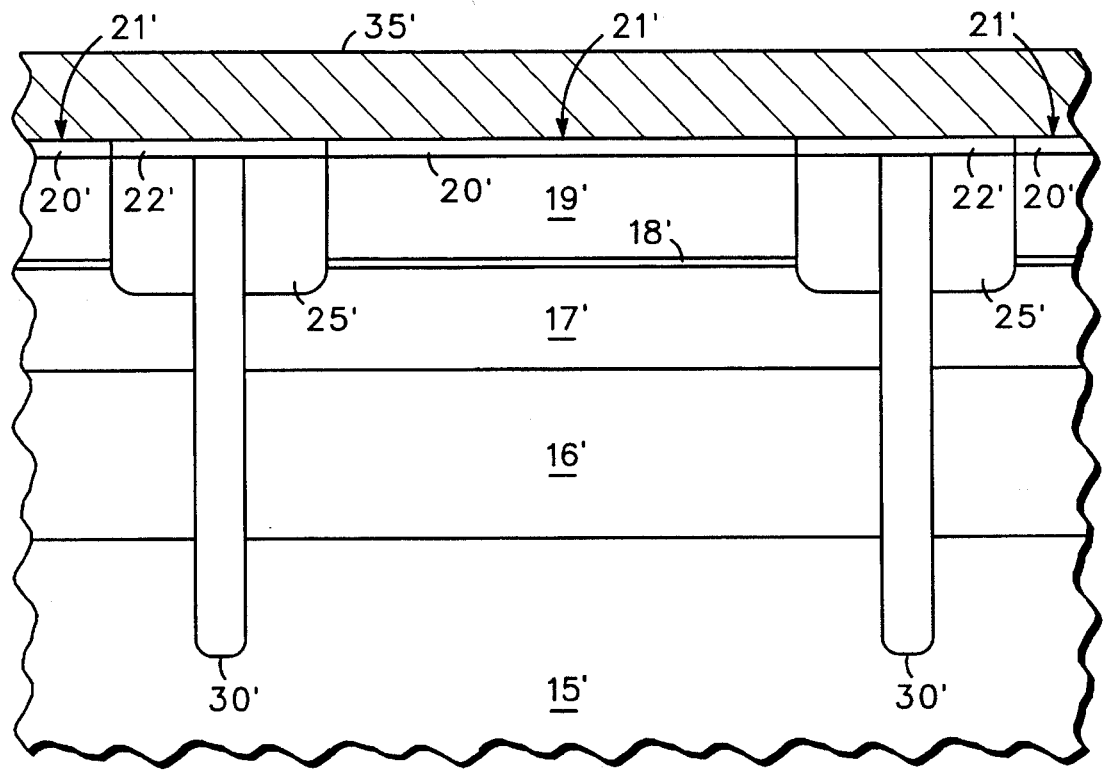
FIG. 5 is a simplified sectional view of another embodiment of an array of light emitting diodes embodying the present invention.

Referring to FIG. 5, a second structure or embodiment of an array of light emitting diodes is illustrated in a simplified sectional view, portions thereof broken away. The second structure includes a substrate 15' having an upper surface on which is positioned, in the following order, a conductive layer 16', a first carrier confinement layer 17', an active layer 18', a second carrier confinement layer 19' and a conductive cap layer 20'. Separation of the various layers into a plurality of light emitting diodes is achieved by implanting impurity material to form an isolating resistive volume, or moat 25', around each of a plurality of defined light emitting areas 21'. Resistive moat 25' laterally confines current flow across the P-N junction (carrier confinement layer 19', active layer 18' and carrier confinement layer 17') of each of the light emitting diodes and, therefore, defines the emitting region of each of the light emitting diodes.

It should be understood that cap layer 20' is generally removed, or selectively deposited, to form exposed areas 22'. In the present embodiment, the exposed row areas and exposed column areas define a matrix of diode light emitting areas 21'. Also, in the described embodiment carrier confinement layer 17' and conductive layer 16' are common to each light emitting diode. This allows the lower terminals (carrier confinement layer 17') of each of the light emitting diodes in each column to be conveniently connected in common. However, in this embodiment it is necessary to isolate the columns of light emitting diodes from each other to prevent crosstalk therebetween.

The column isolation is provided by an isolation implant 30' extending downwardly through carrier confinement layer 19', active layer 18', carrier confinement layer 17' and conductive layer 16' to electrically isolate adjacent columns from each other. In the specific embodiment illustrated, isolation implant 30' need only isolate the N-type layers (carrier confinement layer 17' and conductive layer 16'), since resistive moat 25' isolates the P-type layers (carrier confinement layer 19' and active layer 18').

The remainder of the fabrication process includes patterning interconnect metallization. The lower terminal of each light emitting diode, which in this embodiment is the cathode, in each column is connected to the lower terminal of each other light emitting diode in the column through conductive layer 16'. An external contact 34 (see FIG. 6) is connected to conductive layer 16' adjacent an end thereof. Similarly, the upper terminal of each diode (light emitting area 21' of cap layer 20') in each row is connected by a connection 35' which also serves as a row bus (see FIG. 6). Thus, the upper terminal of each light emitting diode in a row is connected to the upper terminal of each other light emitting diode in the row.

A more complete description of an array similar to that illustrated in FIG. 5 and process for fabrication of the array is disclosed in a copending Patent Application entitled "Implanted LED Array and Method of Fabrication", filed of even date herewith, assigned to the same assignee and included herein by reference.

Thus, a new array and pixel design is disclosed which uses only highly doped buried layer 16 or 16' beneath the light emitting diode double heterostructure as the common column interconnect and cathode contact for each pixel in a column. This connection eliminates the need for column bus metallization and the associated minimum dimension and alignment tolerances required for its formation. As can be seen in FIG. 6, the space between pixels drops from 2 minimum line widths plus 2 alignment tolerances to a single minimum line width retained for isolation. With the 2 micron design rules and emission dimensions cited above, the linear fill factor increases to $10/12=0.833$ and the area fill factor comes up to $(0.833)^2=0.694$. This is nearly a factor of 3 increase in the area fill factor and significantly increases the quality of displayed images.

In addition, narrow, high aspect ratio trenches 26 and 27 between pixels replanarize much more readily than the topology resulting from the metallized interconnect utilized in the copending application entitled "Electro-optic Integrated Circuit and Method of Fabrication" first cited above. This simpler replanarizing makes the fabrication process less complicated, more repeatable and more reliable.

Generally, semiconductor layers have a significantly lower conductivity than metal interconnects and, consequently, increased column resistance is expected with this design. Buried semiconductor layer 16 or 16' should be designed for maximum conductivity by making it as thick and as heavily doped as possible, or practical, using, for example, n-type GaAs to achieve the highest carrier mobility. Still, the conductivity will generally be lower than that of a metal interconnect. However, because in the standard scanned array the column interconnects carry current for only a single light emitting diode (~50 microamps), the resulting voltage drop along the column interconnect is small compared to the forward voltage of the light emitting diode (~2.0 volts). For layer 16 or 16' which is 10 micrometers wide, 1.0 micrometer thick, doped n-type to $10^{18}$ $cm^3$ with electron mobility of 3000 $cm^2$/volt-sec, the resistance is 20.8K ohms/cm (compared to only 244 ohms/cm for a 2 micrometer by 0.5 micrometer Au strip). However, for a display having 144 rows of light emitting diodes with a pixel pitch of 12 micrometers and a pixel current drive of 50 microamperes, the voltage drop along the semiconductor column interconnect (layer 16 or 16') is only 0.18 volts, which is less than 10% of the forward voltage of the light emitting diode. Therefore, the increased resistance of the column interconnects in not a problem.

Throughout this description references to rows and columns are made for simplicity of the disclosure but it will be understood by those skilled in the art that these terms are completely interchangeable since rows and columns of a matrix generally depend upon a physical orientation and are changed, for example, by simply rotating the device 90°. Further, while specific sequences of steps have been disclosed and claimed, it will be understood by those skilled in the art that many of the steps are interchangeable, and the exact sequence utilized depends upon the specific methods applied, including chemicals, temperatures, etc. Further, it should be understood that neither the sequence disclosed nor claimed is intended to in any way limit the present invention to a specific sequence of steps.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a high density light emitting diode array with semiconductor interconnects comprising the steps of:

providing a substrate of non-conductive material with a major surface, a conductive layer of material on the major surface of the substrate, a first carrier confinement layer on the conductive layer, an active layer on the first carrier confinement layer and a second carrier confinement layer on the active layer;

separating portions of the second carrier confinement layer, the active layer and the first carrier confinement layer into a plurality of light emitting diodes positioned in rows and columns and separating the conductive layer into a plurality of columns connecting a first contact of each light emitting diode in a column to a first contact of each other light emitting diode in the column;

forming column contacts connected to the conductive layer at an end of each column; and forming a second contact on the cap layer of each light emitting diode and connecting second contacts for each light emitting diode in a row to the second contacts of all other light emitting diodes in the row.

2. A method of fabricating a high density light emitting diode array with semiconductor interconnects comprising the steps of:

providing a substrate of non-conductive material with a major surface, a conductive layer of material on the major surface of the substrate, a first carrier confinement layer on the conductive layer, an active layer on the first carrier confinement layer and a second carrier confinement layer on the active layer;

separating portions of the second carrier confinement layer, the active layer and the first carrier confinement layer into a plurality of light emitting diodes positioned in rows and columns including selectively etching through the second carrier confinement layer, the active layer and into the first carrier confinement layer to form a plurality of rows and selectively etching through the second carrier confinement layer, the active layer, the first carrier confinement layer, the conductive layer and into the substrate to form a plurality of columns;

forming column contacts connected to the conductive layer at an end of each column; and forming a row contact on the cap layer of each light emitting diode and connecting row contacts for all light emitting diodes in a row.

3. A method of fabricating a high density light emitting diode array with semiconductor interconnects comprising the steps of:

providing a substrate of non-conductive material with a major surface;

forming a conductive layer of material on the major surface of the substrate;

forming a first carrier confinement layer on the conductive layer;

forming an active layer on the first carrier confinement layer;

forming a second carrier confinement layer on the active layer;

separating portions of the second carrier confinement layer, the active layer and the first carrier confinement layer into a plurality of light emitting diodes positioned in rows and columns including selectively etching through the second carrier confinement layer, the active layer and into the first carrier confinement layer to form a plurality of rows and selectively etching through the second carrier confinement layer, the active layer, the first carrier confinement layer and the conductive layer to the substrate to electrically separate the columns of mesas;

selectively depositing a first metallization layer in contact with the conductive layer at an end of each column to provide a first electrode for each of the light emitting diodes in columns; and selectively depositing a second metallization layer on a portion of each of the mesas to form a second electrode for each of the light emitting diodes and to connect the second electrodes in rows.

4. A method of fabricating a high density light emitting diode array with semiconductor interconnects as claimed in claim 3 wherein the step of providing a substrate includes providing a substrate of gallium arsenide.

5. A method of fabricating a high density light emitting diode array with semiconductor interconnects as claimed in claim 4 wherein the step of forming a conductive layer of material includes growing an epitaxial layer of gallium arsenide doped with an impurity to produce N-type conductivity.

6. A method of fabricating a high density light emitting diode array with semiconductor interconnects as claimed in claim 5 wherein the step of forming a first carrier confinement layer includes growing an epitaxial layer of indium-gallium-aluminum-phosphide doped with an impurity to produce N-type semiconductivity.

7. A method of fabricating a high density light emitting diode array with semiconductor interconnects as claimed in claim 6 wherein the step of forming an active layer includes growing an epitaxial layer of indium-gallium-aluminum-phosphide.

8. A method of fabricating a high density light emitting diode array with semiconductor interconnects as claimed in claim 7 wherein the step of forming a second carrier confinement layer includes growing an epitaxial layer of indium-gallium-aluminum-phosphide doped with an impurity to produce P-type semiconductivity.

9. A method of fabricating a high density light emitting diode array with semiconductor interconnects comprising the steps of:

providing a substrate of non-conductive material with a major surface;

forming a conductive layer of material on the major surface of the substrate;

forming a first carrier confinement layer on the conductive layer;

forming an active layer on the first carrier confinement layer;

forming a second carrier confinement layer on the active layer;

selectively forming a conductive cap layer on the second carrier confinement layer to provide exposed surface areas of the second confinement layer defining exposed row areas and exposed column areas with a matrix of diode light emitting areas covered by the conductive cap layer positioned in rows and columns therebetween;

separating portions of the second carrier confinement layer, the active layer and the first carrier confinement layer into a plurality of light emitting diodes positioned in rows and columns including implanting an impurity in the exposed row and column areas through the second carrier confinement layer and at least through the active layer to form an isolating resistive volume around each diode light emitting area and implanting another impurity in the exposed column areas through the second carrier confinement layer, the active layer, the first carrier confinement layer, the conductive layer and at least into the substrate to form an isolating resistive volume between each column of diode light emitting areas;

selectively depositing a first metallization layer in contact with the conductive layer at an end of each column, the conductive layer connecting a first electrode for each of the light emitting diodes in columns; and selectively depositing a second metallization layer on a portion of each of the mesas to form a second electrode for each of the light emitting diodes and to connect the second electrodes in rows.

10. A method of fabricating a high density light emitting diode array with semiconductor interconnects as claimed in claim 9 wherein the step of providing a substrate includes providing a substrate of gallium arsenide.

11. A method of fabricating a high density light emitting diode array with semiconductor interconnects as claimed in claim 10 wherein the step of forming a conductive layer of material includes growing an epitaxial layer of gallium arsenide doped with an impurity to produce N-type conductivity.

12. A method of fabricating a high density light emitting diode array with semiconductor interconnects as claimed in claim 11 wherein the step of forming a first carrier confinement layer includes growing an epitaxial layer of indium-gallium-aluminum-phosphide doped with an impurity to produce N-type semiconductivity.

13. A method of fabricating a high density light emitting diode array with semiconductor interconnects as claimed in claim 12 wherein the step of forming an active layer includes growing an epitaxial layer of indium-gallium-aluminum-phosphide.

14. A method of fabricating a high density light emitting diode array with semiconductor interconnects as claimed in claim 13 wherein the step of forming a second carrier confinement layer includes growing an epitaxial layer of indium-gallium-aluminum-phosphide doped with an impurity to produce P-type semiconductivity.

15. A method of fabricating a high density light emitting diode array with semiconductor interconnects as claimed in claim 14 wherein step of forming the conductive cap layer of material includes growing an epitaxial layer of gallium arsenide doped with an impurity to produce P-type conductivity.

* * * * *